(12) United States Patent
Jansson

(10) Patent No.: US 8,446,158 B1
(45) Date of Patent: May 21, 2013

(54) COMPENSATION FOR PARASITIC CAPACITANCE OF A CAPACITIVE SENSOR

(75) Inventor: Håkan Karl Jansson, Åkersberga (SE)

(73) Assignee: Cypress Semiconductor Corporation, San Jose, CA (US)

(*) Notice: Subject to any disclaimer, the term of this patent is extended or adjusted under 35 U.S.C. 154(b) by 893 days.

(21) Appl. No.: 12/267,487

(22) Filed: Nov. 7, 2008

Related U.S. Application Data

(60) Provisional application No. 60/986,677, filed on Nov. 9, 2007.

(51) Int. Cl.
*G01R 27/08* (2006.01)
*G01R 35/00* (2006.01)

(52) U.S. Cl.
USPC .......................... 324/686; 324/601

(58) Field of Classification Search
USPC ......................................... 324/686
See application file for complete search history.

(56) References Cited

U.S. PATENT DOCUMENTS

| | | | |
|---|---|---|---|
| 4,636,714 A * | 1/1987 | Allen | 324/678 |
| 5,136,262 A * | 8/1992 | Spencer | 331/135 |
| 5,576,628 A | 11/1996 | Caliboso et al. | |
| 5,730,165 A * | 3/1998 | Philipp | 137/1 |
| 5,992,950 A * | 11/1999 | Kumar et al. | 303/151 |
| 6,700,392 B2 * | 3/2004 | Haase | 324/674 |
| 6,768,420 B2 | 7/2004 | McCarthy et al. | |
| 6,882,164 B2 * | 4/2005 | Yano et al. | 324/663 |
| 7,006,938 B2 | 2/2006 | Laraia et al. | |
| 7,075,864 B2 | 7/2006 | Kakitsuka et al. | |
| 7,129,714 B2 | 10/2006 | Baxter | |
| 7,253,643 B1 | 8/2007 | Seguine | |
| 7,307,485 B1 | 12/2007 | Snyder et al. | |
| 7,504,833 B1 | 3/2009 | Seguine | |
| 8,093,914 B2 | 1/2012 | Maharyta et al. | |
| 2004/0247163 A1 | 12/2004 | Hara | |
| 2005/0283330 A1 | 12/2005 | Laraia et al. | |
| 2006/0006883 A1 * | 1/2006 | Foote | 324/678 |
| 2006/0290677 A1 * | 12/2006 | Lyon et al. | 345/173 |
| 2007/0173220 A1 | 7/2007 | Kim et al. | |
| 2008/0036473 A1 | 2/2008 | Jansson | |
| 2008/0158178 A1 * | 7/2008 | Hotelling et al. | 345/173 |
| 2008/0312857 A1 | 12/2008 | Sequine | |
| 2009/0108914 A1 | 4/2009 | Zhang et al. | |
| 2009/0174417 A1 | 7/2009 | Remmers et al. | |

* cited by examiner

Primary Examiner — Jeff Natalini

(57) ABSTRACT

An apparatus for converting a capacitance measured on a capacitive sensor to a digital code may include a modulation capacitor to receive charge transferred from the sensor and compensation circuitry to divert charge from the modulation capacitor. A method for operating the apparatus may include generating a digital bitstream based on the capacitance of the sensor and compensating for a parasitic capacitance of the capacitive sensor.

21 Claims, 8 Drawing Sheets

COMPENSATION FOR PARASITIC CAPACITANCE OF A CAPACITIVE SENSOR

CROSS-REFERENCE TO RELATED APPLICATIONS

This application claims the benefit of U.S. Provisional Patent Application No. 60/986,677, filed Nov. 9, 2007.

TECHNICAL FIELD

This disclosure relates to the field of user interface devices and, in particular, to capacitive sensor devices.

BACKGROUND

In general, capacitive sensors are intended to replace mechanical buttons, knobs, and other similar mechanical user interface controls. Capacitive sensors allow the elimination of such complicated mechanical controls and provide reliable operation under harsh conditions. Capacitive sensors are also widely used in modern customer applications, providing new user interface options in existing products.

Capacitive sensing systems generally operate by detecting a change in the capacitance of a capacitive sensor resulting from proximity or contact of an object with the sensor. The ability to resolve changes in capacitance may be impaired if the changes in capacitance to be detected by the sensor are small relative to the capacitance of the sensor.

For instance, a capacitive sensor that is configured to detect an input, such as proximity or contact with a finger or other object, may have a capacitance $C_P$ when no input is present. The capacitance $C_P$ is known as the parasitic capacitance of the sensor. An input detected by the sensor may cause a change in capacitance $C_F$ that is much smaller than $C_P$. Accordingly, the parasitic capacitance $C_P$ is represented by a larger proportion of the discrete capacitance levels resolvable by the bitstream, while the capacitance change $C_F$ is represented by fewer of these discrete levels. In such cases, the capacitance change $C_F$ due to an input may not be resolvable to a high degree of resolution.

BRIEF DESCRIPTION OF THE DRAWINGS

The present disclosure is illustrated by way of example, and not by way of limitation, in the figures of the accompanying drawings.

DETAILED DESCRIPTION

Figure 1:
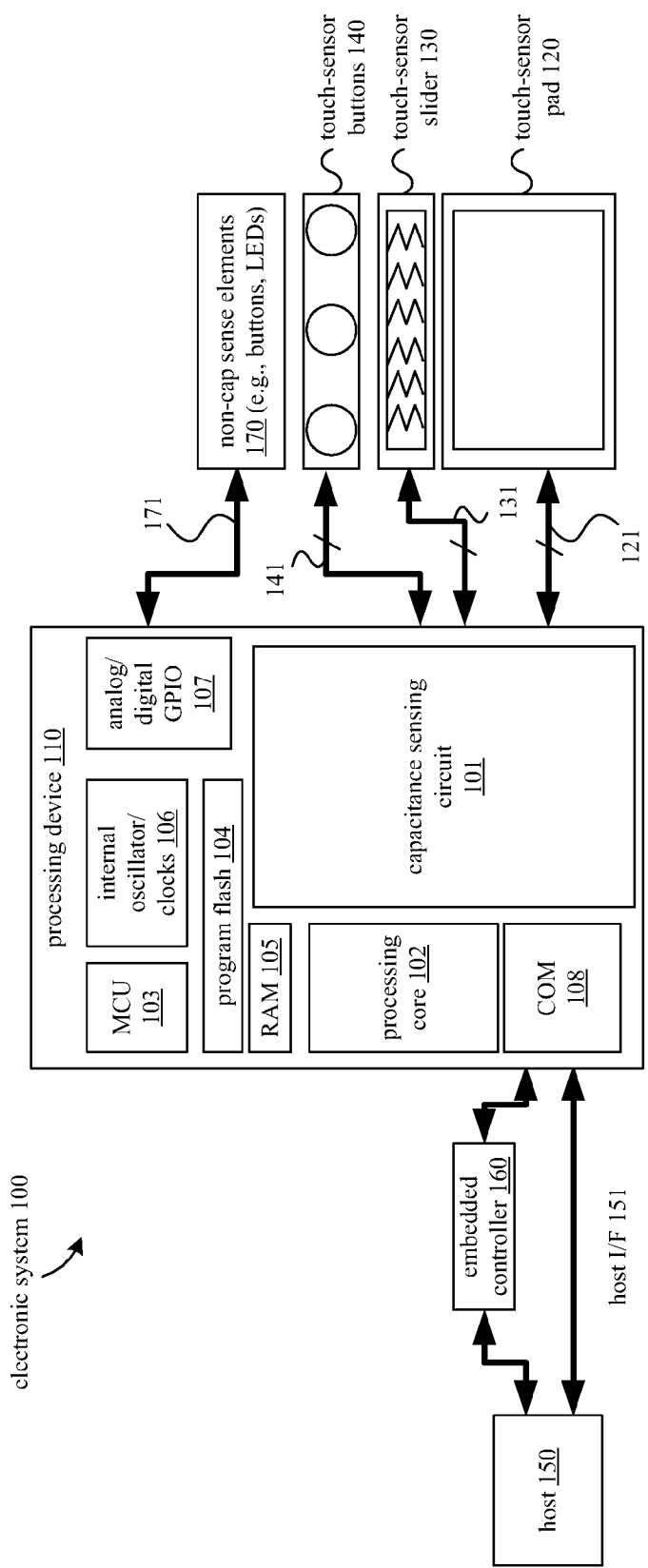
FIG. 1 illustrates a block diagram of one embodiment of an electronic system having a processing device for detecting a presence of a conductive object.

Described herein is a method and apparatus for converting a capacitance measured on a sensor element to a digital code. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of a method and apparatus for converting a capacitance measured on a capacitive sensor element to a digital code are described. In one embodiment, such a capacitance to code converter includes capacitance sensing circuitry that measures changes in the capacitance $C_S$ of the capacitive sensor and generates a digital bitstream based on the measured capacitance $C_S$. Changes in the capacitance $C_S$ of the capacitive sensor may be caused by inputs, such as a finger or other object in proximity or in contact with the capacitive sensor. These changes are reflected in the bitstream, which can be processed by a computer system or other circuit.

In one embodiment, the capacitance sensing circuitry converts the sensor capacitance $C_S$ to a code, or bitstream, by alternately charging the sensor capacitor and transferring charge from the sensor capacitor to a modulation capacitor. Over a number of iterations, the charge stored in the modulation capacitor increases, corresponding to an increase in the voltage level $V_N$ of the modulation capacitor. The voltage level $V_N$ of the modulation capacitor is compared with a reference voltage $V_{REF}$. In one embodiment, a bit is asserted on the output bitstream when the modulation capacitor voltage $V_N$ reaches $V_{REF}$.

Since the amount of charge that can be stored over a given time period by the sensor capacitor changes with the capacitance of the sensor capacitor, the amount of charge transferred to the modulation capacitor from the sensor capacitor also changes accordingly. Thus, when the capacitance of the sensor capacitor increases, more charge is stored over time in the modulation capacitor, and the modulation capacitor voltage rises to the reference voltage more quickly. Accordingly, the density of bits asserted on the output bitstream increases with the capacitance $C_S$ of the sensor.

In cases where the capacitance change $C_F$ due to the input is much smaller than the capacitance $C_P$ of the sensor when no input is present, the change in the bit density due to $C_F$ is correspondingly smaller. However, in one embodiment, charge accumulating on the sensor capacitor attributable to $C_P$ can be diverted away from the modulation capacitor using compensation circuitry. This decreases the density of bits corresponding to no input. In conjunction, the dynamic range of the output bitstream can also be increased so that an input corresponds to a higher bit density. This results in a higher resolution of the capacitance range over which change due to an input is likely to occur.

FIG. 1 illustrates a block diagram of one embodiment of an electronic system in which a capacitance to code converter with parasitic compensation circuitry can be implemented. Electronic system 100 includes processing device 110, touch-sensor pad 120, touch-sensor slider 130, touch-sensor buttons 140, host processor 150, embedded controller 160, and non-capacitance sensor elements 170. The processing device 110 may include analog and/or digital general purpose input/output ("GPIO") ports 107. GPIO ports 107 may be programmable. GPIO ports 107 may be coupled to a Programmable Interconnect and Logic ("PIL"), which acts as an interconnect between GPIO ports 107 and a digital block array of the processing device 110 (not illustrated). The digital block array may be configured to implement a variety of digital logic circuits (e.g., DACs, digital filters, or digital control systems) using, in one embodiment, configurable user modules ("UMs"). The digital block array may be coupled to a system bus. Processing device 110 may also include memory, such as random access memory (RAM) 105 and program flash 104. RAM 105 may be static RAM (SRAM), and program flash 104 may be a non-volatile storage, which may be used to store firmware (e.g., control algorithms executable by processing core 102 to implement operations described herein). Processing device 110 may also include a memory controller unit (MCU) 103 coupled to memory and the processing core 102.

The processing device 110 may also include an analog block array (not illustrated). The analog block array is also coupled to the system bus. Analog block array also may be configured to implement a variety of analog circuits (e.g., ADCs or analog filters) using, in one embodiment, configurable UMs. The analog block array may also be coupled to the GPIO 107.

As illustrated, capacitance sensing circuit 101 may be integrated into processing device 110. Capacitance sensing circuit 101 may include analog I/O for coupling to an external component, such as touch-sensor pad 120, touch-sensor slider 130, touch-sensor buttons 140, and/or other devices. Capacitance sensing circuit 101 and processing device 102 are described in more detail below.

The embodiments described herein are not limited to touch-sensor pads for notebook implementations, but can be used in other capacitive sensing implementations, for example, the sensing device may be a touch screen, a touch-sensor slider 130, or touch-sensor buttons 140 (e.g., capacitance sensing buttons). In one embodiment, these sensing devices may include one or more capacitive sensors. It should also be noted that the embodiments described herein may be implemented in other sensing technologies than capacitive sensing, such as resistive, optical imaging, surface wave, infrared, dispersive signal, and strain gauge technologies. Similarly, the operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition and numeric keypad operation.

In one embodiment, the electronic system 100 includes a touch-sensor pad 120 coupled to the processing device 110 via bus 121. Touch-sensor pad 120 may include a multi-dimension sensor array. The multi-dimension sensor array includes multiple sensor elements, organized as rows and columns. In another embodiment, the electronic system 100 includes a touch-sensor slider 130 coupled to the processing device 110 via bus 131. Touch-sensor slider 130 may include a single-dimension sensor array. The single-dimension sensor array includes multiple sensor elements, organized as rows, or alternatively, as columns. In another embodiment, the electronic system 100 includes touch-sensor buttons 140 coupled to the processing device 110 via bus 141. Touch-sensor buttons 140 may include a single-dimension or multi-dimension sensor array. The single- or multi-dimension sensor array may include multiple sensor elements. For a touch-sensor button, the sensor elements may be coupled together to detect a presence of a conductive object over the entire surface of the sensing device. Alternatively, the touch-sensor buttons 140 may have a single sensor element to detect the presence of the conductive object. In one embodiment, touch-sensor buttons 140 may include a capacitive sensor element. Capacitive sensor elements may be used as non-contact sensor elements. These sensor elements, when protected by an insulating layer, offer resistance to severe environments.

The electronic system 100 may include any combination of one or more of the touch-sensor pad 120, touch-sensor slider 130, and/or touch-sensor button 140. In another embodiment, the electronic system 100 may also include non-capacitance sensor elements 170 coupled to the processing device 110 via bus 171. The non-capacitance sensor elements 170 may include buttons, light emitting diodes (LEDs), and other user interface devices, such as a mouse, a keyboard, or other functional keys that do not require capacitance sensing. In one embodiment, buses 171, 141, 131, and 121 may be a single bus. Alternatively, these buses may be configured into any combination of one or more separate buses.

Processing device 110 may include internal oscillator/clocks 106 and communication block 108. The oscillator/clocks block 106 provides clock signals to one or more of the components of processing device 110. Communication block 108 may be used to communicate with an external component, such as a host processor 150, via host interface (I/F) line 151. Alternatively, processing block 110 may also be coupled to embedded controller 160 to communicate with the external components, such as host 150. In one embodiment, the processing device 110 is configured to communicate with the embedded controller 160 or the host 150 to send and/or receive data.

Processing device 110 may reside on a common carrier substrate such as, for example, an integrated circuit (IC) die substrate, a multi-chip module substrate, or the like. Alternatively, the components of processing device 110 may be one or more separate integrated circuits and/or discrete components. In one exemplary embodiment, processing device 110 may be a Programmable System on a Chip (PSoC™) processing device, manufactured by Cypress Semiconductor Corporation, San Jose, Calif. Alternatively, processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like.

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 110 may also be done in the host.

Capacitance sensing circuit 101 may be integrated into the IC of the processing device 110, or alternatively, in a separate IC. Alternatively, descriptions of capacitance sensing circuit 101 may be generated and compiled for incorporation into other integrated circuits. For example, behavioral level code describing capacitance sensing circuit 101, or portions thereof, may be generated using a hardware descriptive language, such as VHDL or Verilog, and stored to a machine-accessible medium (e.g., $C_D$-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensing circuit 101.

It should be noted that the components of electronic system 100 may include all the components described above. Alternatively, electronic system 100 may include only some of the components described above.

In one embodiment, electronic system 100 may be used in a notebook computer. Alternatively, the electronic device may be used in other applications, such as a mobile handset, a personal data assistant (PDA), a keyboard, a television, a remote control, a monitor, a handheld multi-media device, a handheld video player, a handheld gaming device, or a control panel.

Figure 2:
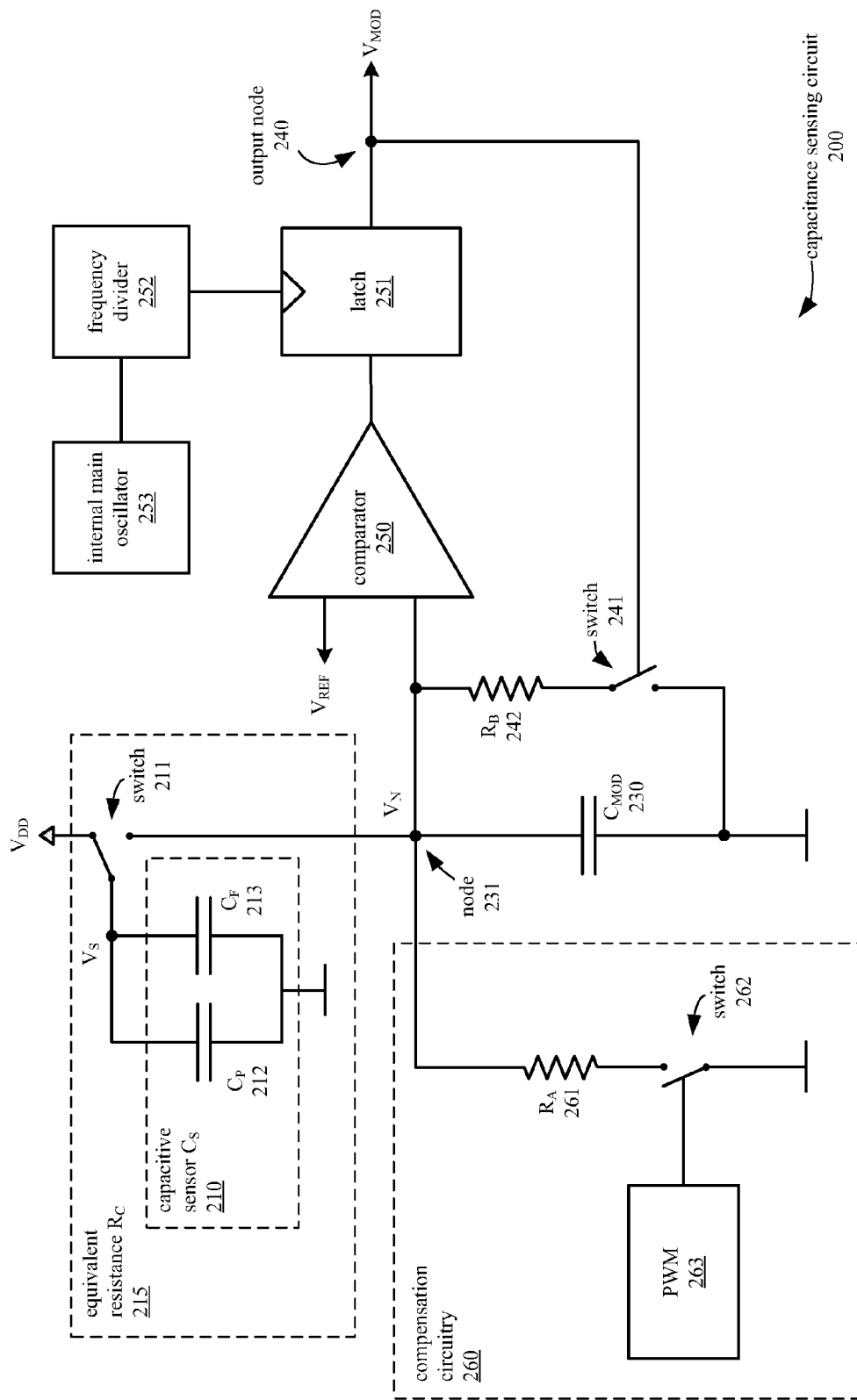
FIG. 2 illustrates one embodiment of a circuit for measuring capacitance of a sensor element that includes a resistor switched by a pulse width modulator (PWM).

FIG. 2 illustrates in detail a capacitance sensing circuit that can be used in electronic system 100, according to one embodiment of the invention. Capacitance sensing circuit 200 includes a capacitive sensor 210 having a capacitance of $C_S$ that is represented by capacitor 212 (having capacitance $C_P$) and capacitor 213 (having capacitance $C_F$). Capacitive sensor 210 is connected to switch 211, which can be connected to either $V_{DD}$ or node 231. Switch 211 and capacitive sensor 210 can be represented as equivalent resistance 215, having a value of $R_C$. The value $R_C$ of equivalent resistance 215 is equal to $1/(fC_S)$, where f is the switching frequency of switch 211. Node 231 is connected to modulation capacitor 230, having a capacitance $C_{MOD}$. Modulation capacitor 230 is connected to discharge resistor 242, having a resistance $R_B$, and switch 241, which is controlled by the voltage $V_{MOD}$ at output node 240. Node 231 is also connected to an input of comparator 250. A reference voltage $V_{REF}$ is connected to another input of comparator 250. An output of comparator 250 is connected to latch 251, which is enabled by frequency divider 252. Frequency divider 252 divides a signal from internal main oscillator 253. The output of latch 251 is connected to output node 240. Capacitance sensing circuit 200 also includes compensation circuitry 260, which further includes resistor 261 (having a value $R_A$), switch 262, and pulse width modulator (PWM) 263. Compensation circuitry 260 is connected to node 231.

Capacitance sensing circuit 200 measures the capacitance $C_S$ of capacitive sensor 210 using sigma-delta modulation. Specifically, sensing circuit 200 alternately charges capacitive sensor 210 and transfers charge from sensor 210 to modulation capacitor 230. Circuit 200 further asserts a bit on an output bitstream when the voltage $V_N$ at node 231 reaches a reference voltage $V_{REF}$. The density of bits, which is the number of asserted bits over time on the bitstream at output node 240, corresponds to the capacitance $C_S$ of the capacitive sensor 210.

Capacitance sensing circuit 200 charges capacitive sensor 210 by connecting the sensor 210 to a positive voltage $V_{DD}$ using switch 211. This results in a potential difference across the terminals of the sensor 210, which charges the sensor 210.

Circuit 200 transfers charge stored on sensor 210 to modulation capacitor 230 by connecting sensor 210 to node 231 using switch 211. Since the voltage $V_S$ on capacitive sensor 210 is higher than the voltage $V_N$ at node 231, current flows from capacitive sensor 210 into node 231, charging the modulation capacitor 230. In one embodiment, the capacitance $C_{MOD}$ of the modulation capacitor 230 is much greater than the capacitance $C_S$ of sensor 210, so that the voltage increase at node 231 is small.

Circuit 200 may then repeat this process of charging sensor 210 and discharging sensor 210 into node 231 to build up charge stored on the modulation capacitor 230 over a number of cycles. This causes an increase in the voltage $V_N$ at node 231 over time.

Node 231 is connected to an input of comparator 250, while the other input of comparator 250 is connected to a reference voltage $V_{REF}$. Comparator 250 thus compares the voltage $V_N$ at node 231 with the reference voltage $V_{REF}$ and asserts its output when $V_N$ reaches $V_{REF}$. The output of comparator is connected to latch 251.

Latch 251 is used to synchronize the output bitstream of the capacitance sensing circuit 200 to a clock signal. The latch 251 is enabled according to a frequency divider 252, which divides a frequency signal provided by internal main oscillator 253. The output of comparator 250 is latched to the output node 240 according to the frequency provided by frequency divider 252. Thus, the digital bitstream generated at the output node 240 has a base period and frequency determined by the frequency divider 252.

The voltage $V_{MOD}$ at output node 240 is also used to operate switch 241. When switch 241 is open, the modulation capacitor is charged from capacitive sensor 210, as previously described. When the voltage level $V_N$ of modulation capacitor 230 reaches $V_{REF}$, the comparator 250 asserts its output and, through latch 251, causes the output node 240 to also be asserted, closing switch 241. When switch 241 is closed, the charge stored on modulation capacitor 230 is discharged through an impedance $R_B$ 242.

Switch 241 reopens when modulation capacitor 230 has discharged enough so that the voltage $V_N$ at node 231 no longer exceeds $V_{REF}$. This reopening of switch 241 may be delayed by operation of the latch 251, which synchronizes the output operating switch 241 to a clock signal according to frequency divider 252. With switch 241 open, the modulation capacitor 230 continues storing charge transferred from capacitive sensor 210 in the next charge transfer cycle.

For each period during which switch 241 is open, the voltage $V_N$ at node 231 increases at a rate that depends on the capacitance $C_S$ of capacitive sensor 210. When $C_S$ is higher, more charge is stored in $C_S$ for each cycle of switch 211. Thus, more charge is transferred to modulation capacitor 230 when sensor 210 is connected to modulation capacitor 230 by switch 211. Since the charge accumulates more quickly on modulation capacitor 230, the voltage $V_N$ also reaches $V_{REF}$ more quickly. Accordingly, the comparator 250 asserts its output more frequently and the bit density of the output bitstream at output node 240 increases. The density of bits in the output bitstream thus corresponds to the capacitance $C_S$ of the capacitive sensor 210.

In cases where the capacitance change $C_F$ due to the input is much smaller than the capacitance $C_P$ of the sensor when no input is present, the change in the bit density due to $C_F$ is correspondingly smaller. However, in one embodiment, charge accumulating on the sensor capacitor attributable to $C_P$ can be diverted away from the modulation capacitor using compensation circuitry.

In one embodiment, the compensation circuitry 260 includes an impedance, such as a resistor 261 (having a value $R_A$) that is connected to node 231. During the operation of capacitance sensing circuit 200, as described above, resistor 261 diverts charge away from node 231 that would otherwise continue to be stored in modulation capacitor 230. In one embodiment the value $R_A$ of resistor 261 is chosen so that resistor $R_A$ diverts all or most of the charge attributable to the parasitic capacitance of sensor 210. The charge attributable to the parasitic capacitance is the amount of charge that would be transferred from capacitive sensor 210 if no input were present.

The flow of charge attributable to the parasitic capacitance can also be considered as a parasitic current $I_P$ flowing into node 231. Thus, $R_A$ can be chosen so that the current $I_A$ flowing out of node 231 through resistor 261 is approximately equal to $I_P$. This minimizes the accumulation of charge over time on the modulation capacitor 230, thereby increasing the time for the voltage $V_N$ at node 231 to reach $V_{REF}$. Due to this increase in rise time, the comparator 250 asserts its output less frequently and fewer bits are asserted in the output bitstream, as compared to when compensation circuitry 260 is not used. By reducing the offset due to the parasitic capacitance, compensation circuitry 260 allows the use of a higher value for resistor 242 to optimize the dynamic range of the capacitance sensing circuit 200.

In one embodiment, resistor 261 is connected directly to ground. In an alternative embodiment, resistor 261 is connected to ground through switch 262, which is controlled by pulse width modulator (PWM) 263. The PWM 263 can be used to control switch 262 to adjust the equivalent resistance of compensation circuitry 260. Particularly, the equivalent resistance of compensation circuitry 260 decreases with an increase in the proportion of time that resistor 260 is switched to ground by the PWM 263. PWM 263 can thus be programmed to select an equivalent resistance that balances the compensation current $I_A$ and the parasitic current $I_P$. For example, PWM 263 can be used to compensate for different parasitic capacitances between different capacitive sensors.

In a capacitance sensing circuit 200 that compensates for the offset from parasitic capacitance $C_P$, the dynamic range of the circuit 200 can also be improved by adjusting an impedance, such as resistor 242 having a value $R_B$, through which the modulation capacitor 230 is discharged. Specifically, the resolution of the circuit 200 is proportional to $R_B$, and a higher value of $R_B$ can be used when the parasitic capacitance is compensated using compensation circuitry 260.

In one embodiment where resistor 261 is always connected to ground, a calculation of a value for $R_A$ that will minimize the offset due to parasitic capacitance $C_P$ begins with equations 1 and 2 below. In equations 1 and 2, $d_{mod}$ is the density of bits in the output bitstream, $C_S$ is the capacitance of sensor 210, $f_S$ is the switching frequency of switch 211, $R_B$ is the value of resistor 242, $k_d$ is the ratio of $V_{REF}/V_{DD}$, $C_F$ is a change in capacitance resulting from an input to sensor 210, and $C_P$ is the parasitic capacitance.

$$d_{mod} = C_S f_S R_B \left( \frac{1}{k_d} - 1 \right) - \frac{R_B}{R_A} \qquad (1)$$

$$C_S = C_F + C_P \qquad (2)$$

Substituting equation 2 into equation 1 yields equation 3 below:

$$d_{mod} = C_F f_S R_B \left( \frac{1}{k_d} - 1 \right) + C_P f_S R_B \left( \frac{1}{k_d} - 1 \right) - \frac{R_B}{R_A} \qquad (3)$$

Equation 4 below can then be used to determine the resistance $R_A$ of resistor 261 so that $d_{mod}$ is as close as possible to 0 when $C_F$ is equal to 0:

$$R_A = \frac{k_d}{C_P f_S (1 - k_d)} \qquad (4)$$

Equation 4 further shows that adjusting $k_d$, which is the ratio between voltages $V_{REF}$ and $V_{DD}$, could also be used to trim for differences in parasitic capacitance between individual sensors.

In one embodiment, variations in parasitic capacitances between different sensors is compensated by using PWM 263 to switch resistor 261 to ground. The current flowing through resistor 261 is proportional to the duty cycle of switch 262, so different duty cycle settings can be used for different sensors to obtain a $d_{mod}$ value for each of the different sensors that is as close as possible to 0 when no input is present.

In an alternative embodiment, a pseudo-random sequence generator is used to control switch 262, instead of pulse width modulation.

Figure 3:
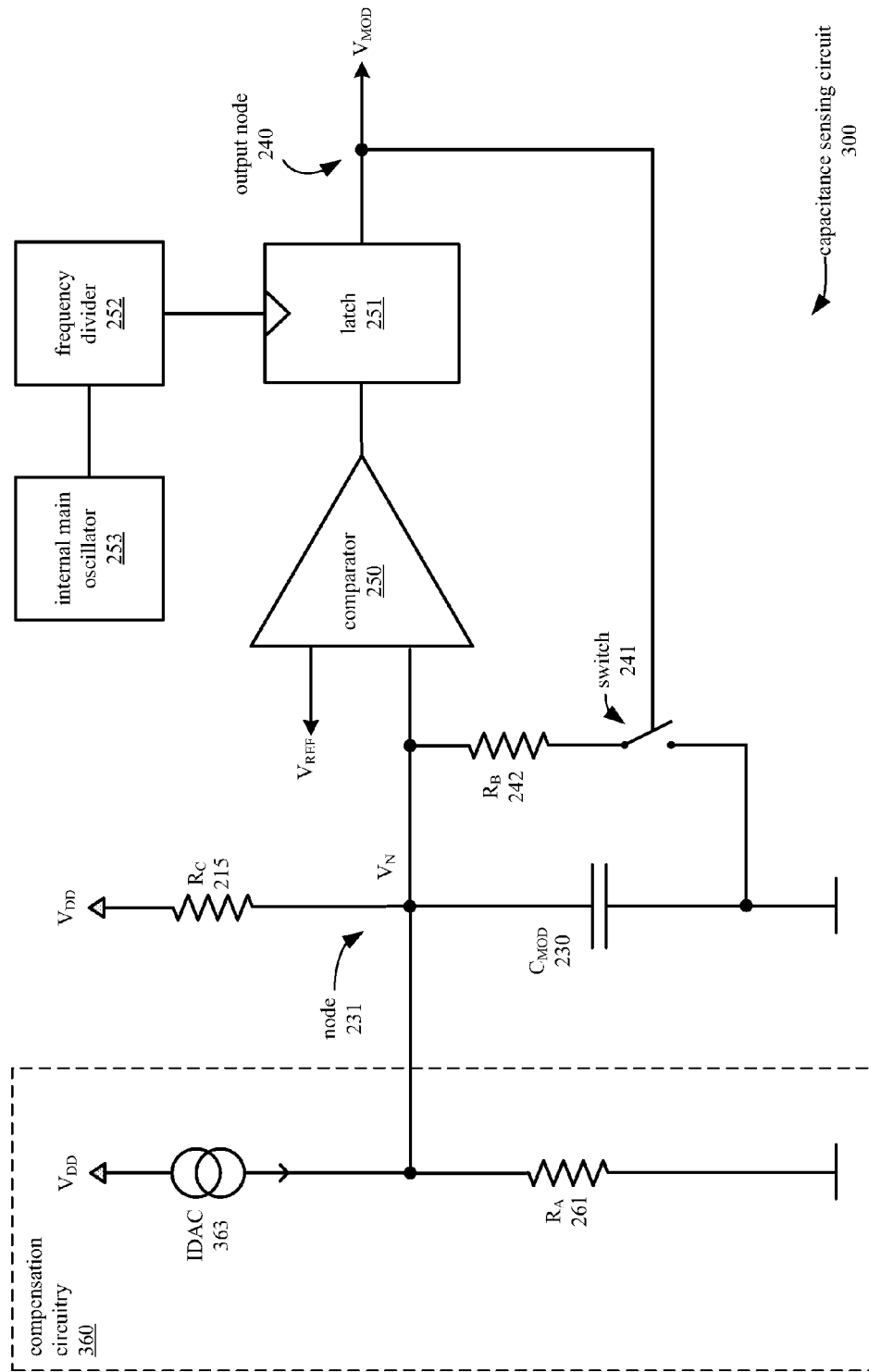
FIG. 3 illustrates one embodiment of a circuit for measuring capacitance of a sensor element that includes a current digital to analog converter (IDAC).

FIG. 3 illustrates a capacitance sensing circuit 300 using compensation circuitry that includes a current digital to analog converter (IDAC) according to one embodiment. Capacitance sensing circuit 300 includes an equivalent resistance 215 having a value of $R_C$, which represents a capacitive sensor having a capacitance $C_S$ and a switch, which can be connected to either $V_{DD}$ or node 231. Node 231 is connected to modulation capacitor 230, having a capacitance $C_{MOD}$. Modulation capacitor 230 is connected to discharge resistor 242, having a resistance $R_B$, and switch 241, which is controlled by the voltage $V_{MOD}$ at output node 240. Node 231 is also connected to an input of comparator 250. A reference voltage $V_{REF}$ is connected to another input of comparator 250. An output of comparator 250 is connected to latch 251, which is enabled by frequency divider 252. Frequency divider 252 divides a signal from internal main oscillator 253. The output of latch 251 is connected to output node 240. Capacitance sensing circuit 200 also includes compensation circuitry 360, which further includes a current digital to analog converter (IDAC) 363 and a resistor 261 having a resistance $R_A$. Compensation circuitry 360 is connected to node 231.

Capacitance sensing circuit 300 operates in similar fashion as capacitance sensing circuit 200, previously described in FIG. 2 above. In circuit 300, resistor 261 similarly diverts charge from node 231 to compensate for parasitic capacitance $C_P$ of the capacitive sensor.

Circuit 300 further includes an IDAC 363 that is used to compensate for variations in parasitic capacitance between different capacitive sensors. For example, a value of $R_A$ may be chosen based on a maximum expected parasitic capacitance $C_{Pmax}$. Thus, for a particular capacitive sensor with a parasitic capacitance that is less than $C_{Pmax}$, IDAC 363 can be programmed to supply a current into node 231 to compensate for the difference in parasitic capacitance.

Equation 5 below relates the currents flowing into and out of node 231. $I_C$ is the current flowing through equivalent resistance 215, $I_D$ is the current supplied by the IDAC 363, $I_A$ is the current flowing through resistor 261, and $I_B$ is the current flowing through resistor 242.

$$I_C + I_D = I_A + I_B \quad (5)$$

Assuming that $I_C$ remains unchanged, $R_A$ can be selected for a desired baseline value of $I_A$. For example, $I_B$ may be minimized by selecting $R_A$ so that $I_A$ is approximately equal to $I_C$ when $C_S$ is equal to $C_{Pmax}$. The IDAC 363 can be programmed to provide a current $I_D$ so that $I_B$ is equal to 0 when no input is present at the capacitive sensor (for $C_P < C_{Pmax}$). Resistor 261 with resistance $R_A$ and IDAC 363 supplying current $I_D$ thus remove an amount of current flowing into node 231 that is attributable to the parasitic capacitance.

Figure 4:
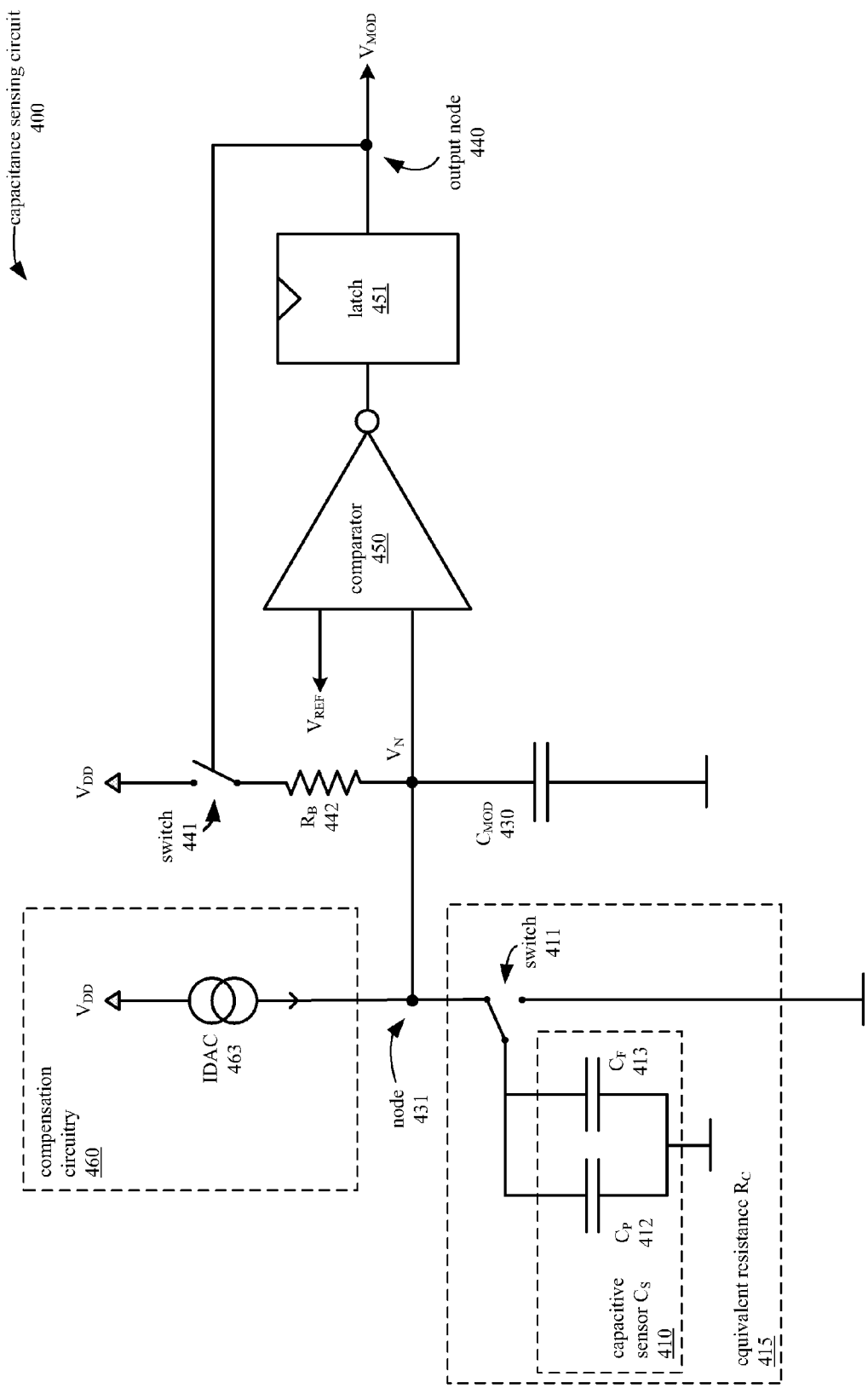
FIG. 4 illustrates one embodiment of a circuit for measuring capacitance of a sensor element that includes a current digital to analog converter (IDAC).

FIG. 4 illustrates a capacitance sensing circuit having compensation circuitry that includes an IDAC, according to one embodiment. Capacitance sensing circuit 400 includes a capacitive sensor 410 having a capacitance of $C_S$ that is represented by capacitor 412 (having capacitance $C_P$) and capacitor 413 (having capacitance $C_F$). Capacitive sensor 410 is connected to switch 411, which can be connected to either ground or node 431. Switch 411 and capacitive sensor 410 can be represented as equivalent resistance 415, having a value of $R_C$. Node 431 is connected to modulation capacitor 430, having a capacitance $C_{MOD}$. Modulation capacitor 430 is connected to discharge resistor 442, having a resistance $R_B$, and switch 441, which is controlled by the voltage $V_{MOD}$ at output node 440. Node 431 is also connected to an input of comparator 450. A reference voltage $V_{REF}$ is connected to another input of comparator 450. An output of comparator 450 is connected to latch 451. The output of latch 451 is connected to output node 440. Capacitance sensing circuit 400 also includes compensation circuitry 460, which further includes IDAC 463. Compensation circuitry 460 is connected to node 431.

Capacitance sensing circuit 400 embodies an alternate configuration where positive charge is removed from modulation capacitor 430 by the capacitive sensor 410 through periodic cycling of switch 411.

Specifically, modulation capacitor 430 is charged through resistor 442 when switch 441 is closed. This raises the voltage $V_N$ at node 431. The positive charge stored in modulation capacitor 430 is transferred to capacitive sensor 410 when switch 411 connects sensor 410 to node 431. The sensor 410 is then discharged to ground through switch 411.

When the capacitance $C_S$ of the sensor 410 increases due to an input, the sensor 410 removes more charge over time from modulation capacitor 430. Thus, the voltage $V_N$ at node 431 falls more quickly to the reference voltage $V_{REF}$. When $V_N$ falls below $V_{REF}$, the comparator 450 deasserts its output high. The output of comparator 450 is latched through latch 451 and a bit is asserted in the bitstream at output node 440.

The voltage at output node 440 controls switch 441, so that when the bit is generated at the output bitstream, switch 441 charges modulation capacitor 430 through resistor 442.

In circuit 400, the parasitic capacitance $C_P$ of the sensor 410 is compensated using IDAC 463, which supplies a current $I_D$ into node 431. $I_D$ is related to the current $I_C$ flowing through the equivalent resistance 415 of the sensor capacitor and the current $I_B$ flowing through resistor 442 by the equation 6 below, where all currents are flowing into node 231.

$$I_C + I_D I_B = 0 \quad (6)$$

In accord with equation 6, the IDAC 463 can be programmed to supply a current $I_D$ that is approximately equal to $-I_C$ when no input is present. Thus, $I_B$ will be approximately 0 when no input is present.

Since IDAC 463 is programmable, the IDAC current $I_D$ can be adjusted to compensate for varying parasitic capacitances. In one embodiment, an iterative successive approximation method is used to determine a value for $I_D$ that minimizes $I_B$ for a particular sensor.

Figure 5:
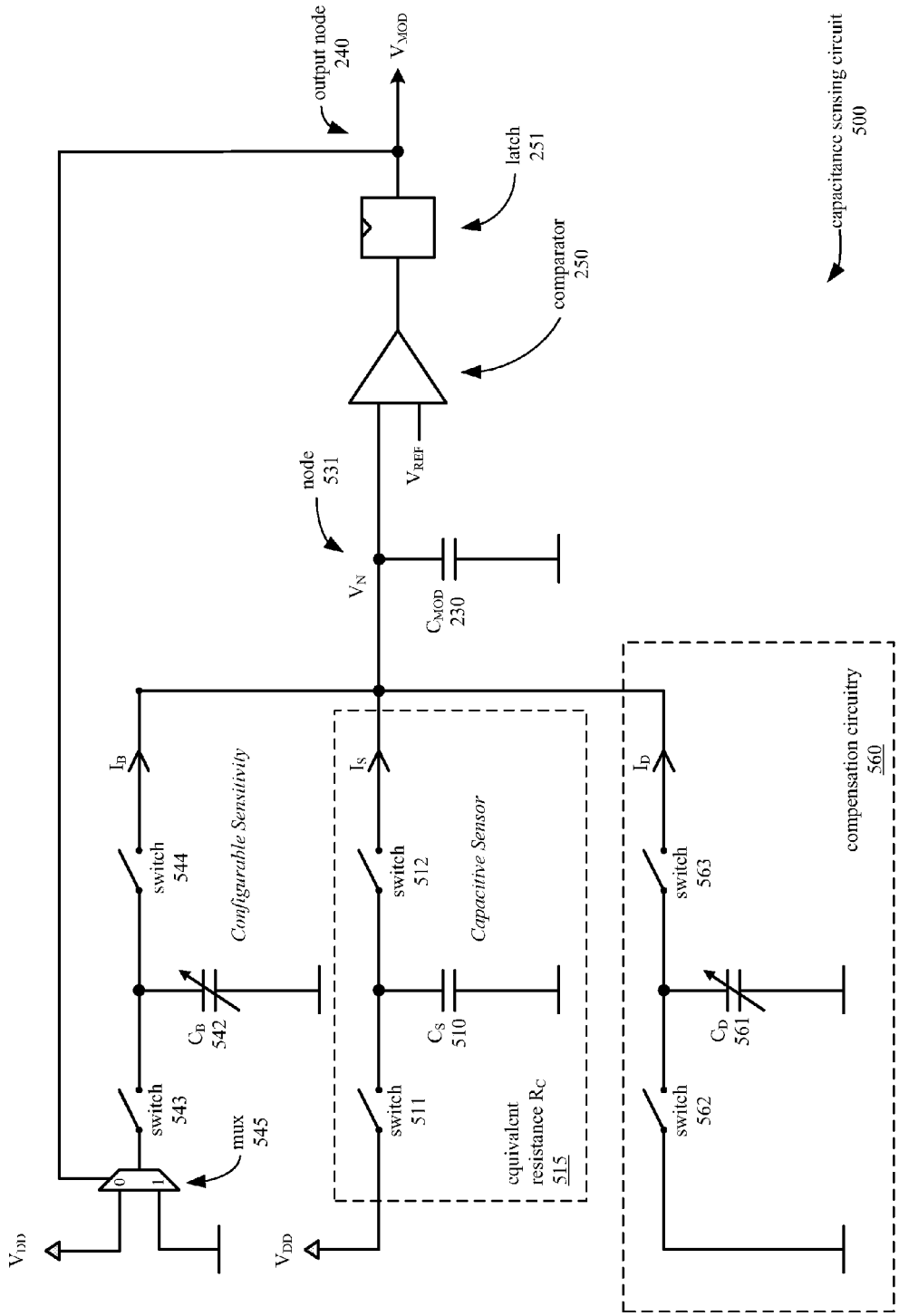
FIG. 5 illustrates one embodiment of a circuit for measuring capacitance of a sensor element that includes switched capacitors.

FIG. 5 illustrates a capacitance sensing circuit that compensates for parasitic capacitance of a sensor using a switched capacitor, according to one embodiment. Capacitance sensing circuit 500 includes a capacitive sensor 510 having a capacitance of $C_S$. The capacitance $C_S$ includes a parasitic capacitance $C_P$ and an input capacitance $C_F$. Capacitive sensor 510 is connected to switches 511 and 512. Switch 511 is connected to supply voltage $V_{DD}$, and switch 512 is connected to node 531. Switches 511 and 512 and capacitive sensor 210 can be represented as equivalent resistance 515, having a value of $R_C$. Node 531 has a voltage $V_N$ and is connected to modulation capacitor 230, having a capacitance $C_{MOD}$. Modulation capacitor 230 is connected to discharge capacitor 542, having a capacitance of $C_B$, through switch 544. Capacitor 542 is further connected to multiplexor (mux) 545 through switch 543. Multiplexor 545 is controlled by the voltage $V_{MOD}$ at output node 240 to connect switch 543 with either $V_{DD}$ or ground. Node 231 is also connected to an input of comparator 250. A reference voltage $V_{REF}$ is connected to another input of comparator 250. An output of comparator 250 is connected to latch 251. The output of latch 251 is connected to output node 240. Capacitance sensing circuit 500 also includes compensation circuitry 560, which further includes capacitor 561, and switches 562 and 563. Compensation circuitry 560 is connected to node 531.

Capacitance sensing circuit 500 operates in similar fashion as capacitance sensing circuit 200 as described with reference to FIG. 2 above, except that resistor 242 is replaced with circuitry including capacitor 542 and switches 543 and 544, and switch 241 is replaced by multiplexor 545. Furthermore, compensation circuitry 260 is replaced in circuit 500 with compensation circuitry 560, which diverts charge from node 531 by alternately charging and discharging compensation capacitor 561 through switches 562 and 563.

More specifically, compensation circuitry 560 diverts charge from node 531 by operating switches 562 and 563 in a non-overlapping manner so that compensation capacitor 561 is repeatedly charged from node 531 and discharged to ground. For example, when switch 563 is closed, switch 562 is open and charge is transferred from modulation capacitor 230 to compensation capacitor 561.

Since switches 562 and 563 operate in a non-overlapping manner, switches 562 and 563 are not simultaneously closed for any duration of time. Instead, switch 563 opens before switch 562 is closed to connect the compensation capacitor 561 to ground. When switch 562 closes, compensation capacitor 561 is discharged to ground.

Thus, over repeated cycling of switches 562 and 563, a current $I_D$ diverts charge from modulation capacitor 230. A desired current $I_D$ can be chosen by selecting the capacitance $C_D$ of compensation capacitor 561 and by selecting an appropriate frequency and duty cycle for switching the switches 562 and 563.

In one embodiment where compensation circuitry 560 includes a switched compensation capacitor 561, the current $I_D$ scales proportionally with changes in $V_{DD}$. This reduces the effect of changes in $V_{DD}$ on the output bitstream of circuit 500.

Instead of a resistor 242 having a value $R_B$ and a switch 241 (as described with reference to FIG. 2), a capacitor 542 having a value $C_B$ is used in conjunction with switches 543 and 544 and multiplexor 545 to configure the sensitivity, or resolution, of the capacitance sensing circuit 500.

When voltage $V_N$ at node 531 exceeds $V_{REF}$, a high bit is generated at output node 240. The voltage at node 240 is used to control multiplexor 545 so that when a high bit is asserted at node 240, the multiplexor 545 connects switch 543 to ground.

When switch 543 is connected to ground, switches 543 and 544 operate in a non-overlapping manner to alternately charge capacitor 542 from node 531 and discharge capacitor 542 to ground through multiplexor 545. Over time, the operation of switches 543 and 544 results in charge flowing out of node 531, represented by a current $I_B$, that discharges the modulation capacitor 230. The voltage $V_N$ at node 531 therefore decreases until it falls below $V_{REF}$, which causes output node 240 to be deasserted low.

When output node 240 is low, the multiplexor 545 connects switch 543 to $V_{DD}$. The operation of switches 543 and 544 then alternately charges capacitor 542 to $V_{DD}$ and then discharges capacitor 542 to $V_N$. This causes the voltage $V_N$ to rise towards reference voltage $V_{REF}$.

In an alternate embodiment, the multiplexor 545 is not used, and switch 543 is connected directly to ground. The voltage at output node 240 is used to gate an output of a clock signal that controls one or both of switches 543 and 544. According to this arrangement, the modulation capacitor 230 is only discharged through capacitor 542 (due to operation of switches 543 and 544) when the voltage $V_N$ at node 531 has exceeded $V_{REF}$ and caused a bit to be asserted high at output node 240.

Assuming all switches 511, 512, 543, 544, 562, and 563 are controlled by the same clock source with frequency f and assuming further that $V_{REF}$ is $V_{DD}/2$, the currents $I_B$, $I_S$, and $I_D$ can be described using equations 7, 8, and 9, respectively:

$$I_B = \left(V_{DD} - \frac{V_{DD}}{2}\right)fC_B(1 - d_{mod}) + \left(0 - \frac{V_{DD}}{2}\right)fC_B d_{mod} = \quad (7)$$
$$V_{DD} fC_B\left(\frac{1}{2} - d_{mod}\right)$$

$$I_S = \left(V_{DD} - \frac{V_{DD}}{2}\right)fC_S = \frac{V_{DD}}{2}fC_S \quad (8)$$

$$I_D = \left(0 - \frac{V_{DD}}{2}\right)fC_D = -\frac{V_{DD}}{2}fC_D \quad (9)$$

Equations 7, 8, and 9 can be substituted into equation 10, simplified to equation 11, and further reduced to equation 12, which relates capacitances $C_B$, $C_S$, and $C_D$, as follows:

$$I_B + I_S + I_D = 0 \quad (10)$$

$$\rightarrow V_{DD} fC_B\left(\frac{1}{2} - d_{mod}\right) + \frac{V_{DD}}{2}fC_S + -\frac{V_{DD}}{2}fC_D = 0 \quad (11)$$

$$\rightarrow C_B\left(\frac{1}{2} - d_{mod}\right) + \frac{1}{2}C_S - \frac{1}{2}C_D = 0 \quad (12)$$

The capacitance $C_S$ of sensor 510 is the sum of the parasitic capacitance $C_P$ and the input capacitance $C_F$, as expressed in equation 13 below.

$$C_S = C_P + C_F \quad (13)$$

Substituting equation 13 into equation 12 yields equation 14 below:

$$C_B\left(\frac{1}{2} - d_{mod}\right) + \frac{1}{2}(C_P + C_F) - \frac{1}{2}C_D = 0 \quad (14)$$

In one embodiment, the dynamic range of the capacitance sensing circuit 500 is theoretically optimized when the density of bits in the output bitstream $d_{mod}$ is 1 when the capacitance $C_F$ due to an input is equal to the maximum expected value $C_{Fmax}$. In addition, the bit density $d_{mod}$ should be 0 when $C_F$ is equal to 0, such as when no input is present.

Thus, for the case where an input detected at the sensor 510, equation 14 substitutes 1 in place of $d_{mod}$ in equation 14, yielding equation 15 below, which further reduces to equations 16 and 17.

$$C_B\left(\frac{1}{2} - 1\right) + \frac{1}{2}(C_P + C_{Fmax}) - \frac{1}{2}C_D = 0 \quad (15)$$

$$\rightarrow -\frac{1}{2}C_B + \frac{1}{2}C_P + \frac{1}{2}C_{Fmax} - \frac{1}{2}C_D = 0 \quad (16)$$

$$\rightarrow -C_B + C_P + C_{Fmax} - C_D = 0 \quad (17)$$

For the case where no input is detected at sensor 510, equation 14 substitutes 0 in place of $d_{mod}$ in equation 13, yielding equation 18 below, which further reduces to equations 19 and 20.

$$C_B\left(\frac{1}{2} - 0\right) + \frac{1}{2}(C_P + 0) - \frac{1}{2}C_D = 0 \quad (18)$$

$$\rightarrow \frac{1}{2}C_B + \frac{1}{2}C_P - \frac{1}{2}C_D = 0 \quad (19)$$

$$\rightarrow C_P - C_D = -C_B \quad (20)$$

Combining equations 17 and 20 yields equations 21 and 22, which express $C_B$ and $C_D$ in terms of the parasitic capacitance $C_P$ and the maximum expected increase in capacitance $C_{Fmax}$ due to an input at sensor 510.

$$C_B = \frac{C_{Fmax}}{2} \quad (21)$$

$$C_D = C_P + \frac{C_{Fmax}}{2} \quad (22)$$

In one embodiment, $C_B$ can be selected based on the highest $C_F$ that is to be measured, and $C_D$ can be determined using successive approximation. In practice, determining $C_D$ using successive approximation may result in a value for $C_D$ that differs from the theoretically ideal capacitance value by an amount $C_{Doff}$.

Inserting the values $C_B$, $C_D$, and $C_{Doff}$ into the current summing equation for node 531 (equation 14) results in equation 23, which reduces to equations 24 and 25.

$$\frac{C_{Fmax}}{2}\left(\frac{1}{2} - d_{mod}\right) + \frac{1}{2}(C_P + C_F) - \frac{1}{2}\left(C_P + \frac{C_{Fmax}}{2} + C_{Doff}\right) = 0 \quad (23)$$

-continued $$\rightarrow \frac{C_{Fmax}}{4} - \frac{C_{Fmax}d_{mod}}{2} + \frac{1}{2}C_P + \frac{1}{2}C_F - \frac{1}{2}C_P - \frac{C_{Fmax}}{4} - \frac{1}{2}C_{Doff} = 0 \quad (24)$$

$$\rightarrow C_F = C_{Fmax}d_{mod} + C_{Doff} \quad (25)$$

In accord with equation 24 above, the capacitance $C_F$, by which an input increases the capacitance of the sensor $C_S$, is directly proportional to the density of bits $d_{mod}$ output by the capacitance sensing circuit 500, although with an offset represented by $C_{Doff}$.

This offset can be minimized to maximize the dynamic range and sensitivity of circuit 500. In one embodiment, minimization of the offset is accomplished by trimming capacitance $C_D$ of compensation capacitor 561. In addition, the offset can be further compensated using software baselining methods.

In one embodiment, trimming of the currents $I_B$ and $I_D$ can be accomplished using programmable capacitors. For example, capacitors 542 and 561 may be programmable so that capacitance values $C_B$ and $C_D$ are adjustable. Alternatively, the $I_B$ and $I_D$ currents can be trimmed by adjusting the switching characteristics of switches 543, 544, 562, and 563. For example, the frequency of the switching can be adjusted to trim the currents. In one embodiment, the switches are independently configurable so that the currents $I_B$ and $I_D$ can be trimmed separately.

Figure 6A:
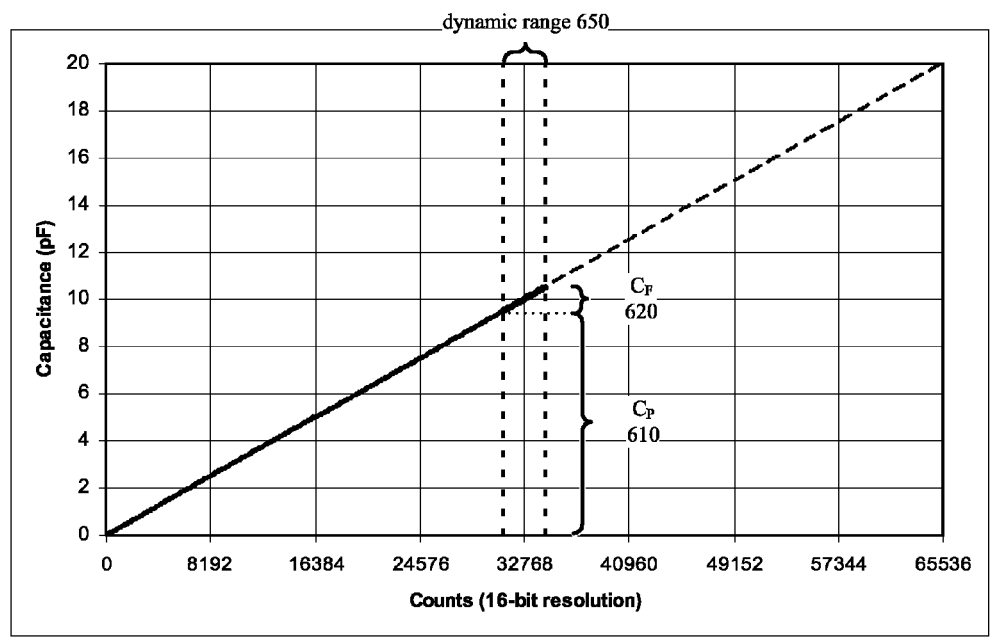
FIG. 6A is a graph correlating count values to capacitance levels of a capacitive sensor, according to one embodiment.

FIG. 6A is a graph illustrating a relationship between measured capacitance of a sensor and count values of bits in an output bitstream, according to one embodiment. Specifically, FIG. 6A illustrates the relationship between count values and sensor capacitance when the parasitic capacitance of the sensor is not compensated.

When the output bitstream is generated by a capacitance sensing circuit, as previously described, the asserted bits in the bitstream are counted. The number of asserted bits corresponds to a measured capacitance value of the sensor. In FIG. 6A, the horizontal axis includes count values from 0 to 65536, while the vertical axis includes a range of possible measured capacitances of the capacitive sensor.

The parasitic capacitance is represented in FIG. 6A as capacitance $C_P$ 610, which has a value of approximately 9.5 pF. Since the parasitic capacitance is not compensated, the count value does not fall below approximately 31,100 counts, which corresponds to the capacitance $C_P$ 610.

Furthermore, the input capacitance $C_F$ 620, which is a change in capacitance due to an input at the capacitive sensor, is much smaller than $C_P$ 610. input capacitance $C_F$ is approximately 1 pF. A sensor capacitance $C_S$ that is measured while an input is present at the sensor includes input capacitance $C_F$ 620 so that $C_S$ is equal to $C_P+C_F$. This value of $C_S$ (about 10.5 pF) corresponds to a count value of approximately 34,400 counts.

Thus, during the normal course of operation of the capacitance sensing circuit, the count value stays within dynamic range 650, which spans approximately 3,300 counts. Accordingly, the capacitance sensing circuit is able to resolve the change in capacitance $C_F$ due to an input to only about 3,300 levels.

Figure 6B:
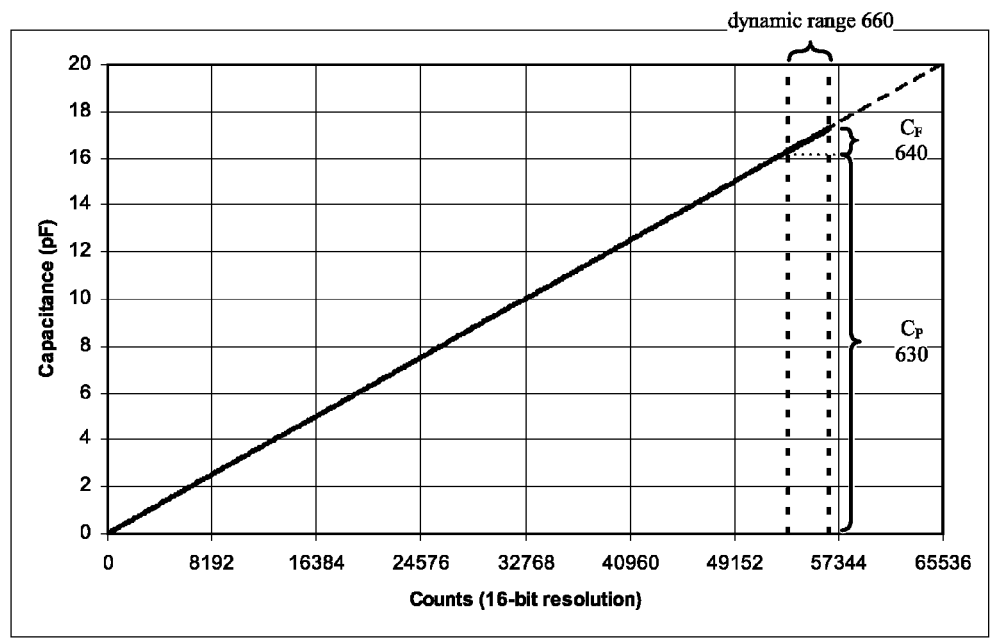
FIG. 6B is a graph correlating count values to capacitance levels of a capacitive sensor, according to one embodiment.

FIG. 6B is a graph illustrating a relationship between count values and sensor capacitance. This relationship is associated with a capacitance sensing circuit in which the parasitic capacitance of the sensor is not compensated. As compared with the capacitance sensing circuit of FIG. 6A, the capacitance sensing circuit of FIG. 6B includes a capacitive sensor having a higher value of $C_P$ 630. Parasitic capacitance $C_P$ 630 is approximately 16.3 pF.

Input capacitance $C_F$ 640 is about 1 pF. When an input is present at the capacitive sensor, the sensor capacitance $C_S$ increases from $C_P$ to $C_P+C_F$ (about 17.3 pF). Accordingly, the count value generated by the capacitance sensing circuit rises from approximately 53,300 counts to approximately 56,600 counts. The dynamic range 660, similar to the dynamic range 650 of FIG. 6A, is also about 3,300 counts. Accordingly, the input capacitance of 1 pF is resolvable to about 3,300 levels.

Figure 7:
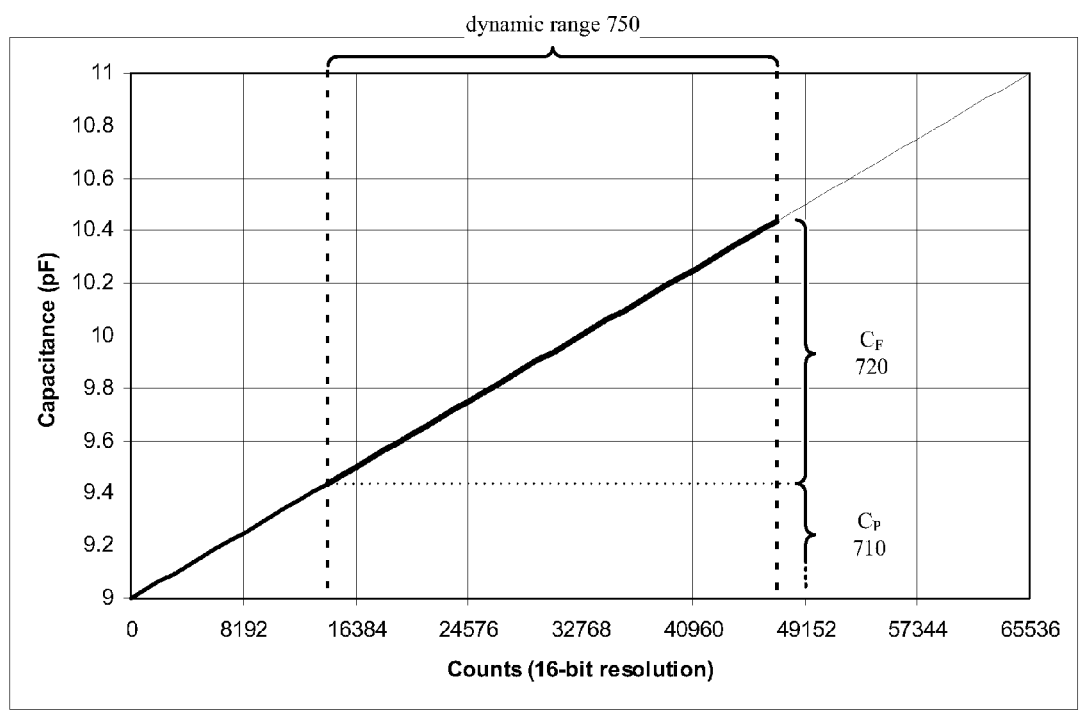
FIG. 7 is a graph correlating count values to capacitance levels of a capacitive sensor for which parasitic capacitance is compensated, according to one embodiment.

FIG. 7 is a graph illustrating a relationship between count values and sensor capacitance. This relationship is associated with a capacitance sensing circuit in which the parasitic capacitance of the sensor is compensated using compensation circuitry.

According to FIG. 7, the parasitic capacitance $C_P$ 710 of the sensor is approximately 9.4 pF and the input capacitance $C_F$ is approximately 1 pF. Notably, only a portion of the parasitic capacitance $C_P$ 710 that is not compensated is visible in the graph in FIG. 7. Thus, the sensor capacitance $C_S$ when an input is present is $C_P+C_F$, which is approximately 10.4 pF.

Since the capacitance sensing circuit compensates for the parasitic capacitance 710, the dynamic range 750 of the capacitance sensing circuit that corresponds to input capacitance $C_F$ can be increased to approximately 33,000 counts. The increase may be effected, for example, by selecting an appropriate value $R_B$ of discharge resistor 242 to increase the gain of the capacitance sensing circuit. Thus, the input capacitance $C_F$ is resolvable to approximately 33,000 levels.

When the parasitic capacitance $C_P$ 710 of 9.4 pF is compensated using compensation circuitry, the capacitance sensing circuit outputs a count value of approximately 14,200 when $C_S$ is equal to $C_P$. When an input is present, $C_S$ is equal to $C_P+C_F$, which is about 10.4 pF. The corresponding count value output by the sensing circuit is about 47,200. The total range of count values from 0-65536 corresponds to a capacitance range of 9-11 pF.

In an alternative embodiment, instead of increasing the resolution of the input capacitance $C_F$, the compensation of parasitic capacitance $C_P$ allows for a faster scan time. For example, instead of a 16-bit count value, the sensor capacitance can be represented using fewer bits, such as 8-bits. Since the fewer bits are being transmitted through the output bitstream, the sampling of the bits takes less time. Holding other factors constant, such as base period and frequency, the 8-bit count value allows a scan time that is less than for the 16-bit count value.

In one embodiment, the dynamic range of the capacitance sensing circuit can be calibrated at various times. For example, the calibration may occur during an initialization of the circuit, or periodically during the operation of the circuit. In one embodiment, calibration may also be initiated by an external input, such as an input from a user or a separate electronic module. Calibration may also be performed upon detecting that the dynamic range of the capacitance sensing circuit does not correspond to a desired range of capacitance values.

In one embodiment, during the calibration process, the count values corresponding to particular sensor capacitance values are shifted. For example, the count value corresponding to a parasitic capacitance value $C_P$ may be adjusted from 31,100 counts before calibration to 14,300 counts after calibration. This lowering of the count value corresponding to the parasitic capacitance is accomplished by adjusting the amount of charge diverted by the compensation circuitry.

For example, with reference to FIG. 2, the amount of charge diverted by compensation circuitry 260 can be selected by changing the frequency and duty cycle of the switching of switch 262 by PWM 263. Thus, calibration can include programming of PWM 263 to operate switch 262 in a particular manner.

With reference to FIGS. 3 and 4, the amount of charge diverted by compensation circuitry 360 or compensation circuitry 460 can be selected by programming IDACs 363 or 463, respectively. Thus, calibration of these sensing circuits 300 and 400 can include programming of IDAC 363 or 463 to supply particular currents into nodes 231 and 431, respectively.

Calibration of the capacitance sensing circuit 500 illustrated in FIG. 5 can include adjustment of the switching frequency of switches 562 and 563 to select a desired current $I_D$ representing the amount of charge diverted from node 531.

In addition to shifting of the dynamic range, the calibration process can also include scaling the dynamic range to increase the count values associated with particular capacitance values. In one embodiment, the dynamic range can be scaled so that the sensor capacitance $C_S$ when an input is present, which is equal to $C_P + C_F$, corresponds to a count value near the upper end of the range of available count values while the sensor capacitance $C_S$ when an input is not present ($C_S \approx C_P$) is maintained at a count value near the lower end of the range of count values. For example, calibration may scale the dynamic range so that a 16-bit count value corresponding to the capacitance $C_P + C_F$ changes from 34,400 before calibration to 47,100 after calibration.

Scaling of the dynamic range can be accomplished by adjusting the impedance through which the modulation capacitor is discharged. For example, with reference to FIGS. 2 and 3, the value $R_B$ of resistor 242 can be selected to scale the dynamic range of sensing circuit 200 or 300. With reference to FIG. 4, the value $R_B$ of resistor 442 can likewise be adjusted to scale the dynamic range of sensing circuit 400.

With reference to FIG. 5, the dynamic range of sensing circuit 500 may be scaled by adjusting the switching frequency of switches 543 and 544, or by adjusting the capacitance of capacitor 542 to select a desired current $I_B$.

Figure 8:
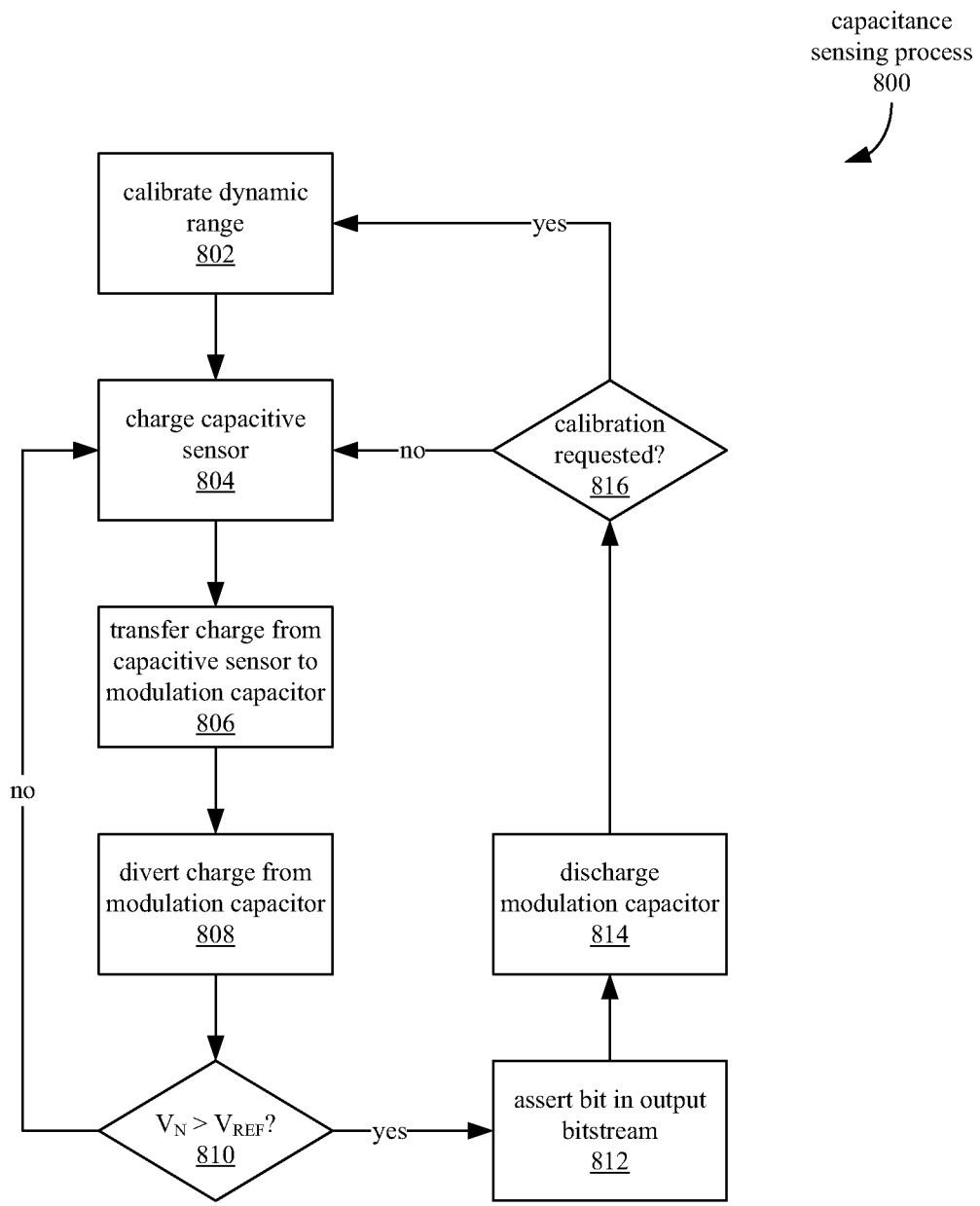
FIG. 8 is a flow chart illustrating a method for compensating for parasitic capacitance of a sensor, according to one embodiment.

FIG. 8 is a flow chart illustrating a process for sensing capacitance of a capacitive sensor, according to one embodiment. Capacitive sensing process 800 may be performed by a capacitance sensing circuit, such as capacitance sensing circuits 200, 300, 400, or 500. In alternative embodiments, the operations of capacitive sensing process 800 may be performed in a different sequence or in parallel.

At block 802 of capacitive sensing process 800, the dynamic range of the capacitance sensing circuit is calibrated. This calibration may include adjusting the impedance through which the modulation capacitor is discharged, and may also include adjusting the amount of charge diverted from the modulation capacitor by the compensation circuitry, as previously described.

At block 804, the capacitive sensor is charged. For example, with reference to FIG. 2, capacitive sensor 210 of capacitance sensing circuit 200 is charged by connecting the sensor 210 with $V_{DD}$ using switch 211. The sensor 210 is then charged by the potential difference between $V_{DD}$ and ground.

At block 806, the charge stored on the capacitive sensor is transferred to the modulation capacitor of the sensing circuit. For example, in capacitance sensing circuit 200, switch 211 connects the charged sensor capacitor 210 with the modulation capacitor 230. If the sensor capacitor 210 has been charged to $V_{DD}$ or some other voltage higher than the voltage $V_N$ at node 231, then charge is transferred from sensor capacitor 210 to modulation capacitor 230.

At block 808, charge is diverted from the modulation capacitor through compensation circuitry. The charge diverted from the modulation capacitor may be positive charge or negative charge. With reference to FIG. 2, compensation circuitry 260 of sensing circuit 200 diverts charge from modulation capacitor 230 through a current from node 231 to ground by operating switch 262. The duty cycle of switch 262 and the resistance $R_A$ of resistor 261 determine the amount of charge that is diverted from modulation capacitor 230.

In one embodiment where the compensation circuitry includes a resistor without a PWM-controlled switch, the value $R_A$ of the resistor determines the amount of charge diverted from the modulation capacitor.

Referring to FIG. 3, a capacitance sensing circuit 300 with compensation circuitry 360 that includes an IDAC 363 and a resistor 261 diverts charge according to block 808 by allowing a current to flow from node 231 to ground through resistor 261. Capacitance sensing circuit 300 also additionally supplies current to node 231 using IDAC 363 to compensate for variations in parasitic capacitances between different sensors.

Referring to FIG. 4, capacitance sensing circuit 400 diverts negative charge away from modulation capacitor 430 in accord with block 808 by using compensation circuitry 460, which includes IDAC 463. IDAC 463 supplies a positive current to node 431, thus removing the negative charge on modulation capacitor 430.

Referring to FIG. 5, capacitance sensing circuit 500 diverts charge from modulation capacitor 230 according to block 808 through compensation circuitry 560. The amount of charge diverted from the modulation capacitor 230 is determined by the capacitance of capacitor 561. In one embodiment, the capacitor 561 is a programmable capacitor having a capacitance that is easily adjusted, for example, during a calibration process. Alternatively, the amount of charge diverted from the modulation capacitor 230 can be determined by the switching frequency of switches 562 and 563.

In one embodiment, the amount of charge that is diverted is approximately an amount of charge that is attributable to the parasitic capacitance $C_P$ represented by capacitor 212 of capacitive sensor 210. Alternatively, the amount of charge diverted may only be a portion of the charge attributable to the parasitic capacitance $C_P$.

At block 810, the voltage level $V_N$ of the modulation capacitor is compared with a reference voltage $V_{REF}$. For example, $V_N$ and $V_{REF}$ may be applied to the inputs of a comparator such as comparator 250. If $V_N$ does not exceed $V_{REF}$, the capacitive sensor is charged at block 804. The operations of blocks 804, 806, 808, and 810 are repeated until $V_N$ exceeds $V_{REF}$.

At block 810, if $V_N$ exceeds $V_{REF}$, then a bit is asserted in the output bitstream in accord with block 812 and the modulation capacitor is discharged in accord with block 814.

At block 812, a bit is asserted in the output bitstream of the capacitance sensing circuit. In one embodiment, the output of comparator 250 is connected to a latch 251, which is enabled according to a clock signal that determines the base frequency of the output bitstream. When the comparator 250 asserts its output, the latch responds by asserting a bit in the output bitstream produced at output node 240.

At block 814, the modulation capacitor is discharged. In one embodiment, a comparator 250 that is used to compare $V_N$ and $V_{REF}$ outputs a signal that discharges the modulation capacitor by connecting it to ground through an impedance, such as resistor 242, using a switch 241. In an alternative embodiment, a signal indicating that $V_N$ exceeds $V_{REF}$ operates a multiplexor, such as multiplexor 545.

In another embodiment, a signal indicating that $V_N$ exceeds $V_{REF}$ gates a clock signal that controls switches, such as switches 543 and 544, connected to a switched capacitor 542. The gated clock signal causes the switches 543 and 544 to operate in a non-overlapping manner to alternately charge capacitor 542 from the modulation capacitor 230 and discharge capacitor 542 to ground, thus removing charge from the modulation capacitor 230.

At block 816, the process determines whether calibration of the capacitance sensing circuit is requested. In one embodiment, the calibration process is triggered periodically to maintain a desired dynamic range for the sensing circuit. In alternative embodiments, the calibration may occur only during initialization of the sensing circuit, or may occur in response to a request from an external source, such as a user.

If calibration is not requested, then calibration is not performed and the process continues with charging the capacitive sensor and transferring charge to the modulation capacitor according to blocks 804, 806, 808, and 810. If calibration is requested, then calibration can be performed according to block 802 as previously described.

As described above, the embodiments described herein describe a capacitance-to-code converter that allows continuous operation by providing a continuous output bitstream. Embodiments of the capacitance-to-code converter further compensate for parasitic capacitances of sensor capacitors to optimize dynamic range of the capacitance sensing circuitry.

The embodiments described herein may have the advantage of keeping all benefits of existing charge transfer/accumulation methods (especially in the high immunity for RF/EMI noise signals), and may be configured for easy implementation in existing devices from hardware and software perspectives, as well as in future devices.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., $C_D$-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:
   a sensor capacitor;
   a modulation capacitor coupled with the sensor capacitor and configured to receive charge from the sensor capacitor;
   compensation circuitry coupled with the sensor capacitor and the modulation capacitor, wherein the compensation circuitry is configured to divert a portion of the charge from the modulation capacitor, and wherein the portion of the charge diverted is based on an amount of a parasitic capacitance of the sensor capacitor measured during a calibration of the compensation circuitry; and
   a comparator circuit coupled with the modulation capacitor, wherein the comparator circuit is configured to discharge the modulation capacitor in response to detecting that the charge on the modulation capacitor exceeds a predetermined threshold; wherein the comparator circuit produces a digital code based on a frequency of the discharge of the modulation capacitor.

2. The apparatus of claim 1, wherein the compensation circuitry comprises a resistor.

3. The apparatus of claim 1, wherein the compensation circuitry comprises a switch controlled by a pulse width modulator (PWM) circuit.

4. The apparatus of claim 3, wherein the switch is configured to change an impedance of the current path.

5. The apparatus of claim 1, wherein the compensation circuitry comprises a current digital to analog converter (IDAC).

6. The apparatus of claim 5, wherein the IDAC is configured to divert a portion of the charge attributable to a parasitic capacitance of the sensor capacitor.

7. The apparatus of claim 1, wherein the compensation circuitry comprises a switched capacitor.

8. The apparatus of claim 7, wherein a switch alternately connects the switched capacitor to ground and to the modulation capacitor.

9. The apparatus of claim 1, wherein the portion of the charge is attributable to a parasitic capacitance of the sensor capacitor.

10. A method, comprising:
    charging a sensor capacitor;
    transferring charge from the sensor capacitor to a modulation capacitor;

generating a digital bitstream based on a capacitance of the sensor capacitor; and compensating for a parasitic capacitance of the sensor capacitor by diverting charge from the modulation capacitor through compensation circuitry, and wherein an amount of the diverted charge is based on an amount of the parasitic capacitance measured during a calibration of the compensation circuitry.

11. The method of claim 10, further comprising:

discharging the modulation capacitor in response to detecting that the charge on the modulation capacitor exceeds a predetermined threshold; and producing a digital code based on a frequency of the discharge of the modulation capacitor.

12. The method of claim 11, wherein the compensation circuitry comprises a resistor.

13. The method of claim 11, wherein the compensation circuitry comprises a switch controlled by a pulse width modulator (PWM) circuit.

14. The method of claim 13, further comprising using the switch to change an impedance of the current path.

15. The method of claim 11, wherein the compensation circuitry comprises a current digital to analog converter (IDAC).

16. The method of claim 15, wherein the IDAC is configured to divert a portion of the charge attributable to a parasitic capacitance of the sensor capacitor.

17. The method of claim 11, wherein the compensation circuitry comprises a switched capacitor.

18. The method of claim 17, wherein a switch alternately connects the switched capacitor to ground and then to the modulation capacitor.

19. The method of claim 11, wherein the compensation circuitry is configured to divert the portion of the charge attributable to a parasitic capacitance of the sensor capacitor.

20. An apparatus, comprising:

means for generating a digital bitstream based on a capacitance of a sensor capacitor; and means for compensating for a parasitic capacitance of the sensor capacitor by diverting charge from a modulation capacitor through compensation circuitry, and wherein an amount of the diverted charge is based on an amount of the parasitic capacitance measured during a calibration of the compensation circuitry.

21. The apparatus of claim 20, further comprising means for diverting current attributable to the parasitic capacitance of the sensor capacitor.

* * * * *